United States Patent
Katori

(10) Patent No.: US 9,553,597 B2
(45) Date of Patent: Jan. 24, 2017

(54) OPTICAL LATTICE CLOCK, CLOCK DEVICE AND LASER LIGHT SOURCE

(71) Applicant: RIKEN, Saitama (JP)

(72) Inventor: Hidetoshi Katori, Wako (JP)

(73) Assignee: RIKEN, Saitama (JP)

( * ) Notice: Subject to any disclaimer, the term of this patent is extended or adjusted under 35 U.S.C. 154(b) by 5 days.

(21) Appl. No.: 14/422,177

(22) PCT Filed: Aug. 12, 2013

(86) PCT No.: PCT/JP2013/071795
§ 371 (c)(1),
(2) Date: Feb. 17, 2015

(87) PCT Pub. No.: WO2014/027637
PCT Pub. Date: Feb. 20, 2014

(65) Prior Publication Data
US 2015/0194972 A1    Jul. 9, 2015

(30) Foreign Application Priority Data
Aug. 17, 2012 (JP) ................................. 2012-181175

(51) Int. Cl.
*H03L 7/26* (2006.01)
*G04F 5/14* (2006.01)
*H01S 3/067* (2006.01)

(52) U.S. Cl.
CPC . *H03L 7/26* (2013.01); *G04F 5/14* (2013.01); *H01S 3/06791* (2013.01)

(58) Field of Classification Search
CPC ........... H03L 7/26; H01S 3/06791; G04F 5/14

USPC ....................... 331/94.1; 385/4, 132; 77/94.1
See application file for complete search history.

(56) References Cited

U.S. PATENT DOCUMENTS

2004/0131179 A1    7/2004    Ichimura et al.
2011/0097045 A1    4/2011    Benabid

FOREIGN PATENT DOCUMENTS

JP    2004-187274 A    7/2004
JP    2008-529049 A    7/2008

OTHER PUBLICATIONS

Bajcsy et al., "Laser-cooled atoms inside a hollow-core photonic-crystal fiber," *Physical Review A 83*, 063830, 2011, 9 pages.
Couny et al., "Large-pitch kagome-structured hollow-core photonic crystal fiber," *Optics Letters* 31(24):3574-3576, Dec. 15, 2006.
(Continued)

Primary Examiner — Richard Tan
(74) Attorney, Agent, or Firm — Seed IP Law Group LLP

(57) ABSTRACT

Various embodiments improve accuracy by increasing the number of atoms engaged in a clock transitions in an optical lattice clock. An exemplary optical lattice clock an embodiment comprises an optical waveguide, an optical path, a laser light source, and a laser cooler. The optical path has a hollow pathway that extends from a first end to a second end while being surrounded with a tubular wall, which is used as a waveguide path. The optical path passes between mirrors and through the pathway. The laser light source supplies to the optical path a pair of lattice lasers (L1 and L2) propagating in opposite directions with each other. The laser cooler supplies cooled atoms that have two levels of electronic states associated with a clock transition to the vicinity of the first end of the optical waveguide.

21 Claims, 6 Drawing Sheets

(56) References Cited

OTHER PUBLICATIONS

Derevianko et al., "*Colloquium*: Physics of optical lattice clocks," *Review of Modern Physics* 83:331-347, 2011.
Katori, "Invention and development of optical lattice clocks," *Oyo Buturi* 81(8)656-662, 2012. (with English Abstract).
Katori, "Optical lattice clocks and quantum metrology," *Nature Photonics* 5:203-210, Apr. 2011.
Kishimoto et al., "Electrodynamic Trapping of Spinless Neutral Atoms with an Atom Chip," *Physical Review Letters 96,* 123001, Mar. 31, 2006, 4 pages.
Liu et al., "Laser guiding of cold molecules in a hollow photonic bandgap fiber," *J. Opt. Soc. Am. B* 26(5):1076-1083, May 2009.
Nagorny et al., "Optical lattice in a high-finesse ring resonator," *Physical Review A 67,* 031401, 2003, 4 pages.

$k_p \Delta x <$ Lamb-Dicke condition is satisfied

OPTICAL LATTICE CLOCK, CLOCK DEVICE AND LASER LIGHT SOURCE

TECHNICAL FIELD

The present disclosure is related to an optical lattice clock, a clock device, and a laser light source. More specifically, the present disclosure is related to an optical lattice clock, a clock device, and a laser light source, each of which uses principle of optical lattice clocks for high precision operation.

BACKGROUND ART

Atomic clocks have been conventionally used for a reference time standard. The atomic clocks have been generally accepted as representative ones of high precision clocks and have been adopted for primary references of time as an example. On top of that, the atomic clocks have been applied to fields that require high preciseness such as GPS (Global Positioning System), where each GPS satellite is equipped with an atomic clock. Generally speaking, atomic clocks utilize electromagnetic waves in a microwave region for a frequency reference, which waves are produced through transitions between electronic levels (hereinafter called "clock transitions") in atoms (hereafter including ions) such as Cs (caesium) and Rb (rubidium).

Moreover, miniaturization of atomic clocks are also envisioned because atomic clocks with portability would be applied broadly. For example, an atomic clock called CSAC (Chip Scale Atomic Clock) is currently commercially available. CSACs with volume of ~16 cm$^3$ with frequency uncertainty of ~$10^{-11}$ have been developed.

Furthermore in another R&D trend, optical atomic clocks have been developed for the purpose of time measurement and frequency reference with higher precision than atomic clocks, where laser lights with high stable frequency are used for optical transitions of isolated atoms or ions in free space. However, it is not easy to obtain portability in such optical atomic clocks because they are equipped with ultra-stable laser light sources that use bulky vacuum facility equipment and anti-vibration devices of high precision.

Likewise, a clock called optical lattice clock has been developed for the superb preciseness over conventional atomic clocks and have gathered much attention for their operational principle (see for example Non-Patent Document 1 for a review article). In general, the optical lattice clocks use a spatial periodic structure through a standing wave of light or electromagnetic wave (hereinafter called "optical lattice") and utilize clock transitions of atoms trapped at antinodes (lattice points) of the standing wave of the optical fields in the optical lattice. It is to be noted that the optical lattice clocks may be referred to as examples of atomic clocks or optical atomic clocks. In the present patent application, however, an optical lattice clock denotes an atomic clock that utilizes the optical lattice, and thus the optical lattice clocks are distinguished from atomic clocks or optical atomic clocks.

REFERENCES

Non-Patent Documents

Non-Patent Document 1: Katori, H., "Optical lattice clocks and quantum metrology", Nature Photon. 5, 203-210 (2011).

Non-Patent Document 2: Couny, F., Benabid, F. and Light, P. S., "Large-pitch kagome-structured hollow-core photonic crystal fiber", Opt. Lett. 31, 3574-3576 (2006).

Non-Patent Document 3: Kishimoto, T. et al., "Electrodynamic Trapping of Spinless Neutral Atoms with an Atom Chip", Phys. Rev. Lett. 96, 123001 (2006).

BRIEF SUMMARY

Technical Problem

In the cases of atomic clocks or optical atomic clocks, interaction such as collisions between atoms and the inner wall of a housing container of the atoms is one of limiting factors of theirs accuracy. Generally speaking, miniaturization would result in relative increase of ramifications due to collision between the atoms and the container interior wall; thereby the preciseness of the atomic clocks would be affected. For example, in atomic clocks envisioning miniaturization such as CSAC and the like, atoms are placed in a small volume space, and therefore the problem of interaction between the atoms and the wall arises.

In contrast, the problem of interaction between the atoms and the wall of the container or the like mentioned above is substantially solved by the optical lattice clocks. Moreover it is possible to improve preciseness in accordance with the operational principle, particularly when a special wavelength called a magic wavelength for the optical lattice is adopted. On top or that, increasing the number of atoms engaged in clock transitions in general, or, to be more specific, increasing substantial volume of a spatial region where the atoms can be trapped in the optical lattice, would be most favorable in improving accuracy for increasing the number of trapped atoms.

The present disclosure contributes to realization of an optical lattice clock, a clock device, and a laser light source, of high precision, by providing specified structures that make it possible to increase the number of atoms, while taking advantage of substantially zero interaction between atoms engaged in clock transitions and wall of container or the like.

Solution to Problem

The inventor of the present application sought an approach in which effective volume can be expanded while implementing precise operation of optical lattice clocks. It should be noted that the effective volume mentioned above is given as a product of the number of lattice points and volume for each lattice point that is capable of trapping atoms. For the purpose of expanding effective volume it would be advantageous to increase the number of lattice points by enlarging dimension of spatial region of standing wave, where the standing wave is formed by interference of a pair of lattice lasers ("lattice laser pair"), and where each of the lasers are propagating in opposite directions with each other. This is because interactions with other atoms would create uncertainty due to frequency shifting, or collision shifting, which should be suppressed. In fact, such collision shifting is a limiting factor of uncertainty in the case of, for example, Cs atomic fountain clocks. To prevent the collision shifting, it is ideal to have 1-10 atoms or so per a lattice point. In such a case dimension for total length of the spatial region of standing wave, or length required for the optical lattice, is estimated to be 4 cm in total, assuming that the number of atoms for each lattice point to be 1 and the total number of atoms trapped at the same time to be ~$10^5$.

However, in reality, it is difficult to enlarge the dimension of spatial region for the standing wave so long as the optical lattice is produced through a conventional method. This limitation concerning the dimension is related to the fact that size of a spatial region suitable for high accuracy spectroscopy of atoms is restricted to around a spatial region of size of Rayleigh length for a lattice laser adopted. For example, in the case of one-dimensional optical lattice, the longer the Rayleigh length is, the weaker the Doppler effect of in-plane motion of atoms becomes, because shape of wave front for the laser comes to resemble a plane shape than ever. However, at the same time, trap of atoms becomes weak because of enlarged beam diameter of the laser. Such a tradeoff stifles expansion of spatial region dimension that is suitable for operating spectroscopy with high accuracy.

Accordingly, the inventor of the present application sought a workaround for such beam property of the lattice laser or restriction due to the Rayleigh length. As a result, it has been found that expanding dimension of a spatial region suitable for high-accuracy spectroscopy of atoms, or expanding dimension of a spatial region suitable for operating optical lattice clocks, is achieved when an optical waveguide with a hollow pathway is adopted.

In one aspect of the present disclosure, what is provided is an optical lattice clock comprising an optical waveguide having a hollow pathway surrounded with a tubular wall for its waveguide path. The optical lattice clock uses two levels of electronic states of atoms for clock transitions, the atoms being trapped by an optical lattice formed in the hollow pathway. The optical lattice is an optical lattice of a magic wavelength, the magic wavelength being a wavelength that generates a mutually identical amount of light-shift for each of the two levels.

In the aspect of the present disclosure mentioned above, the hollow pathway in the optical waveguide extends from a first end to a second end. The optical lattice clock further comprising a laser light source that forms the optical lattice in the hollow pathway by supplying a pair of lattice lasers, each of the lattice lasers propagating in opposite direction with each other; and a laser cooler that cools the atoms for supplying cooled atoms into the vicinity of the first end of the optical waveguide. The cooled atoms trapped by the optical lattice in the hollow pathway make the clock transitions between the two levels of electronic states.

The optical lattice clock in this application is, for example, comprised of an optical waveguide having a hollow pathway surrounded with a tubular wall for its waveguide path, the hollow pathway extending between a first end to a second end; a laser light source that forms an optical lattice in the hollow pathway by supplying a pair of lattice lasers, each of the lattice lasers propagating in opposite direction with each other; and a laser cooler that cools the atoms for supplying the cooled atoms into the vicinity of the first end of the optical waveguide, the cooled atoms having two levels in its electronic states that are engaging to clock transitions, wherein the pair of lattice lasers are a pair of lasers of a magic wavelength, where the magic wavelength is a wavelength that generates a mutually identical amount of light-shift for each of the two levels, and wherein the cooled atoms trapped by the optical lattice in the hollow pathway make the clock transitions between the two levels of electronic states.

In the aspect of the present disclosure mentioned above, for example, the pair of lattice lasers of the laser light source forms, for the optical lattice, a moving photonic lattice, or a moving lattice, that moves in the hollow pathway of the optical waveguide from the first end to the second end. The cooled atoms are introduced into the hollow pathway at the first end and trapped by the moving lattice for making the clock transitions while being transported through the hollow pathway from the first end to the second end.

The optical waveguide for the aspects of the present disclosure surrounds the hollow pathway with the tubular wall, and the pathway extends from the first end to the second end. Accordingly, the cooled atoms can pass through the pathway of the optical guide, for example, from the first end to the second end of the pathway. The cooled atoms make clock transitions while being trapped by the optical lattice. The optical lattice moves while trapping the atoms through the hollow pathway. It brings some advantage to optical lattice clocks to implement the aspects of the present disclosure, which use the hollow pathway. Since the pathway is a part of the optical path of the ring resonator, the moving photonic lattice, or moving lattice, is formed there by the pair of lattice lasers supplied into the ring resonator. It should be noted that cross sectional shape of the pathway surrounded with the tubular wall is not limited to specific ones; it can be selected form circle, ellipse, polygon, or a combination of segments with such shape, or indeterminate form.

It is advantageous for the optical lattice clocks of the aspects of the present disclosure, when the optical waveguide is a hollow core photonic crystal fiber (HC-PCF), and the hollow pathway of the optical waveguide is a pathway formed by a hollow core of the HC-PCF.

A hollow core photonic crystal fiber (hereinafter referred to as "HC-PCF") is an example of preferable optical waveguides mentioned above. The HC-PCF may be a waveguide in optical region generally having a structure of extended tube like shape as disclosed in Non-Patent Document 2, for example, which allows light to propagate in the hollow part, or hollow core. The hollow core is surrounded with a clad that may be made of photonic crystal. In aspects of the present disclosure, the moving lattice for the optical lattice clock is formed by laser of such a wavelength that the laser can propagates through the hollow but cannot propagates through the clad.

In the present disclosure provided is a clock device that uses light of a wavelength for reference, the light being emitted through the clock transitions in the optical lattice clock mentioned above. Furthermore, the optical lattice clock of any aspect mentioned above may be further comprised of a ring resonator that utilizes the pathway for a part of its optical path.

In the present disclosure provided is a laser light source comprising the ring resonator in the optical lattice clock mentioned above for a laser resonator, wherein the laser light source has the cooled atoms positioned in the hollow pathway for laser media, and wherein the laser light source outputs light that is produced by stimulated emissions through the clock transitions of the cooled atoms.

Advantageous Effect of Embodiments of the Present Disclosure

According to any aspect of the present disclosure, operation of high precision is achieved, and it is possible to miniaturize optical lattice clocks.

BRIEF DESCRIPTION OF THE DRAWINGS

FIG. 1A is a schematic diagram depicting the setup of the conventional optical lattice clock; FIG. 1B is a schematic diagram depicting a beam waist where atoms are trapped by the optical lattice; and FIG. 1C is a schematic diagram depicting a potential energy seen by the atoms trapped by the optical lattice.

FIG. 3A is a schematic view depicting overall structure where the optical lattice is formed in the optical waveguide and a manner with which atoms are trapped in the optical lattice; whereas FIG. 3B is a cross sectional view indicating the structure of the optical waveguide FIG. 4A is a schematic cross sectional view in a plane, on which a pathway in the HC-PCF 70 extends; whereas FIG. 4B is a schematic cross sectional view in a plane that intersects the pathway.

FIG. 6A is a plan view of a side of a substrate to which a ring resonator is attached; whereas FIG. 6B is a top view seen from the upper direction of paper surface of FIG. 6A.

DESCRIPTION OF THE EMBODIMENT

Figure 1A:
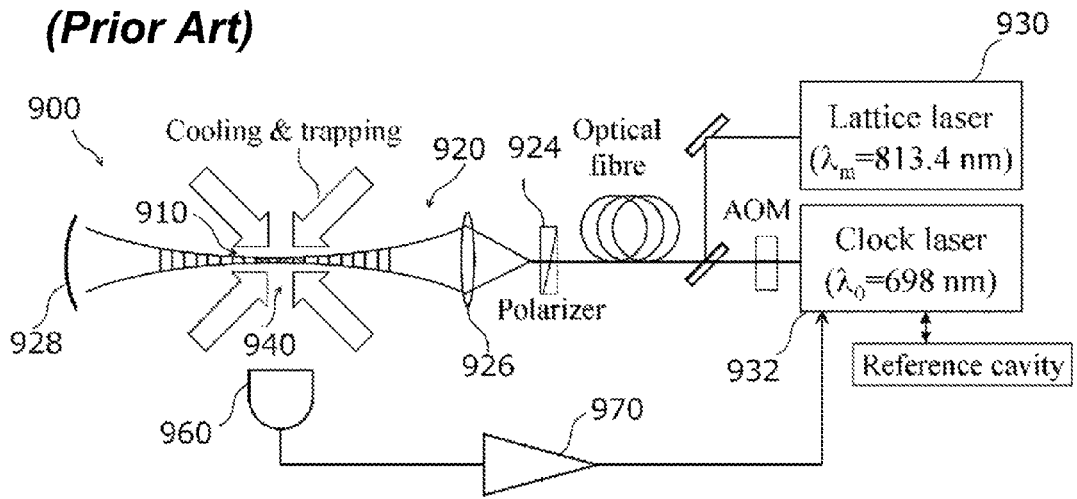
FIGS. 1A-1C is a schematic diagram for illustrating setup and operation principle of a conventional optical lattice clock.

The embodiments of optical lattice clocks of the present disclosure will be described based on the drawings. For all drawings, common reference numerals are given to common part or element unless otherwise noted.

1. Principle of Conventional Optical Lattice Clock

In order to explain operation principles governing optical lattice clocks in the present embodiment, described in the first place is operation and accuracy improvement in the conventional atomic clocks (1-2). Then conventional optical lattice clocks are described (1-3).

1-2. Operation of Conventional Atomic Clocks

To begin with, conventional atomic clocks that utilize transition frequency of clock transitions of atoms are introduced while paying attention to dominant factors on their accuracy as well as approaches concerning the factors. Accuracy in atomic clocks, or uncertainty of clock operation, is determined by, in short, how exactly transition frequency is measured for the clock transitions, and how much surrounding effect to the transition frequency itself is reduced. Therefore, such accuracy will be explained separately for stability during determination of values for the transition frequency (1-2-1) and for exactness of the transition frequency itself (1-2-2).

1-2-1. Stability through Determination of Transition Frequency

Stability during determination of transition frequency denotes how small the number of factors that obstacle measurement for precise determination of the transition frequency is, assuming that the transition frequency is sufficiently exact. One of measures for the stability during the determination of the transition frequency is, so to speak, Allan deviation. The Allan deviation when measurement is carried out over a time duration t, using the number N of atoms are measured per a unit time, e.g., 1 second, is expressed by [Formula 1]

$$\frac{1}{\sqrt{Nt}} \frac{\Delta f}{f}. \quad (1)$$

In this expression, f is a transition frequency with zero electric and zero magnetic fields (hereinafter referred simply as "external field"), $\Delta f$ is a Fourier limit of frequency measurement for transitions of the transition frequency. The smaller the value of the Allan deviation becomes, the more stability is acquired. For this reason, several approaches may be adopted for improving the stability. Following approaches may be specifically adopted: (a) increasing transition frequency f, (b) increasing interaction time T, which influences on $\Delta f$ through a relationship $T=f/\Delta f$, or Fourier limit, and (c) increasing the accumulated number of atoms Nt over which measured results are averaged. To increase the transition frequency f in item (a), the clock transitions may be selected from optical region, in place of microwave region. Optical atomic clocks have been developed from this point of view. The interaction time T in item (b) may be extended to as long as 1 second or more by using a trap of atoms for atomic clocks, such as a Paul trap. Regarding item (c), the number of atoms engaged in clock transitions may be increased, and measurement duration may be increased by extending the measurement time t.

1-2-2. Exactness of Transition Frequency

On the other hand, exactness of the transition frequency denotes how much close the value of the transition frequency to the exact value. To improve the exactness, the following approaches may be adopted: (d) eliminating external fields that may be a source of perturbation regarding the transition frequency f, and (e) excluding effect of shift due to Doppler effect, or Doppler shift, which is caused by atomic motion. The elimination of external field in item (d) may be achieved by, for example, adopting the trap mentioned in connection with item (b). This is because atoms are trapped to center position in an electro-magnetic quadrupole of the Paul trap, for example, or a position having zero external fields in principle. Furthermore, to exclude effect of Doppler shift in item (e), atoms are cooled by laser cooling or the like before making clock shifts, or an approach called confinement into Lamb-Dicke regime. The confinement into Lamb-Dicke regime utilizes a phenomenon in that Doppler effect due to atomic motion is not observed when size of confinement region of tapped atoms is reduced to dimensions sufficiently smaller than a wavelength of atomic interaction such as one corresponding to a transition frequency.

It is to be noted that stability for determining the transition frequency is governed by Allan deviation in Formula (1) when the atoms are single atoms, or when atoms in an atom ensemble are considered to be uncorrelated with one another.

1-2-3.

Current Atomic Clocks

In practice, it may be difficult to have both sufficient stability in determining the transition frequency and sufficient exactness of the transition frequency itself at the same time, even for the atomic clocks whose stability and exactness have been improved according to the approaches mentioned above. For example, when atoms that make clock transitions are ions, it is easy to improve exactness of the transition frequency itself in view of items (d) and (e), and there is substantially no problem for item (b); however, it is difficult to increase the number of atoms N in item (c). This is because repulsions exert between ions due to Coulomb interactions. In such a case, it may sound possible to increase measurement time t during which atoms are observed as in item (c). However, the measurement time t in such an approach should be too long to be applied to time measurement application. For example, it is necessary to observe the atoms for as long as 10 days in order to achieve a highly precise value for Allan deviation of $\sim 10^{-18}$ when $\Delta f/f \sim 10^{-15}$ and $N \sim 1$. There should be a limited number of applications that requires such a long observation for precise time measurement.

1-3.
Optical Lattice Clocks

In the following, operation of optical lattice clocks is described. Generally speaking, a spatial intensity pattern of electro-magnetic field is formed in an optical lattice clock by creating a standing wave with counter-propagating rays of laser light. Then an electric dipole moment is induced on the atoms under the influence of the optical field. Since the dipole moment interacts with the optical field, attractive forces act on the atoms toward positions where the optical field is significant, that is, toward antinode positions of the standing wave, or lattice points of the optical lattice. If the magnitude of the optical field of the optical lattice is sufficient, the atoms are trapped at lattice points. This phenomenon is utilized to keep the atoms floated in the optical lattice clock.

In particular, a higher preciseness is achieved in the optical lattice clocks when a concept called magic wavelength is adopted (Non Patent Document 1). In general, perturbations due to AC Stark shift act on electronic states of atoms (hereinafter the perturbation is called a "light-shift"). Energy value due to the perturbation shows even-order dependence on amplitude of the optical field, such as second powered (second order), and fourth powered (fourth order) and so forth. Of which, significant perturbation comes from the second order factor, and the perturbation energy $U_i$ of state i is expressed as:[Formula 2]

$$U_i = -\tfrac{1}{2} \alpha_i(\omega) |E_L(\omega)|^2, \quad (2)$$

where $E_L(\omega)$ an optical field, $\alpha_i(\omega)$ a coefficient of proportionality for the perturbation energy to the level i. In this regard, the coefficient of proportionality $\alpha_i(\omega)$ has a value dependent on a frequency of the optical field $\omega$ and electronic level i. Since each of perturbation energies depends upon corresponding level, transition frequency determined by a difference between upper and lower levels associated with the clock transitions also depend upon the amplitude of the optical field in general. Therefore, the transition frequency is influenced by frequency of the optical field, or by a wavelength of the optical lattice. In addition, even when intensity of the optical lattice is well controlled, the transition frequency is influenced by intensity distribution within a wavelength of the optical field, which in turn depends upon relative position to the lattice. Therefore, associated clock transitions inside the optical lattice are accompanied by spreads in transition frequency.

However, as explained by the inventor of the present disclosure in Non Patent Document 1, the frequency of the optical field may be selected to be a special frequency or wavelength that brings identical amount of light-shift to both of the upper and lower levels associated with clock transitions of the atoms. Atoms in the optical lattice created with the special frequency or wavelength have identical dependence of energies of the upper and lower levels, thus dependence of the transition frequency on the intensity of the optical field is canceled. If the transition frequency of a clock transitions is independent from the optical field, there is little need to control amplitude of the optical lattice for the purpose of higher accuracy in the transition frequency, and thus the intensity distribution having smaller dimension than the intensity distribution within each optical lattice, or wavelength of the optical field should not produce any spread in the transition frequency. The special wavelength in this regard is called a magic wavelength. The concept of canceling the optical field dependence at the magic wavelength endorses potential capability in optical lattice clocks from an atomic physics point of view, which enables suppression of the perturbation in item (d), which may cause problems in the case of atomic clocks. Since atom's property found in the perturbation by external field to the atom is artificially manipulated, this concept is an example of, so to speak, a perturbation engineering.

Factors governing preciseness will be described in connection with operation of optical lattice clocks that use trapped atoms at the lattice points of the optical lattice operated with a magic wavelength. Under the same context of the atomic clocks mentioned above, estimation of Allan deviation in Formula (1) on the stability and approaches described specifically in items (a)-(c) are also effective for the optical lattice clocks. In particular, optical lattice clocks are advantageous when features of the optical lattice clock are compared with the atomic clocks, in that clock transitions of all atoms in the lattice points are observation target, which allows increasing the number of atoms for improving stability in determining the transition frequency. On top of that, the atoms trapped at lattice points in the optical lattice are confined within a volume sufficiently smaller than the wavelength of light related to the clock transitions, as a result, a condition to eliminate Doppler shift, or a condition for the Lamb-Dicke confinement, is also satisfied. When it comes to the perturbation in item (d), substantial influence of perturbation can be eliminated by the magic wavelength as mentioned above.

Figure 1B:
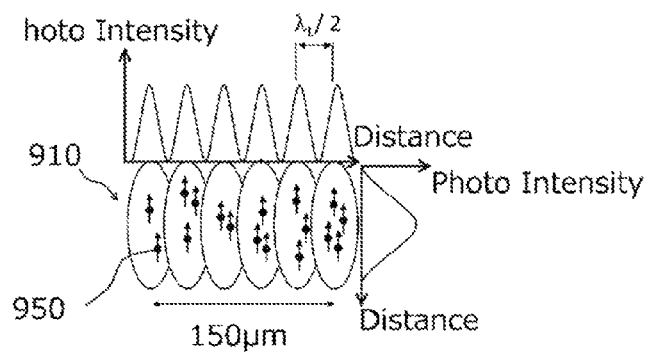
Figure 1C:
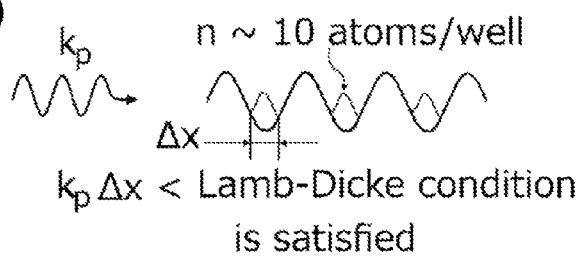

FIGS. 1A-1C is a schematic diagram for illustrating structure and operation principle of a conventional optical lattice clock. Specifically, FIG. 1A is a schematic diagram depicting the setup of the conventional optical lattice clock 900, FIG. 1B is a schematic diagram depicting a beam waist where atoms are trapped by the optical lattice, and FIG. 1C is a schematic diagram depicting a potential energy seen by the atoms trapped by the optical lattice. The conventional optical lattice clock 900 in FIG. 1A has an optical path 920, a laser sources 930 and 932, and laser cooler 940. The laser cooler 940 denotes a spatial part for cooling at which atoms are laser-cooled near the cross points of directions indicated by white arrows from four directions in the drawing. However, six cooling laser lights in total together with additional two directions are used. Cooled atoms 950 of atoms having electronic states of two levels associated with clock transitions are provide between a lens 926 and a mirror 928 in the optical path 920. The space where the cooled atoms 950 travel is evacuated to vacuum, by maintaining a high vacuum in the operation space. The cooled atoms 950 in the optical path 20 are reference atoms, and what is referenced is the light of wavelength that may be absorbed by the clock transitions.

The laser source 930 provides light propagating into the left on the paper surface through a polarizer 924 and lens 926 to the atoms in the optical path 920, that is the reference atoms. After being reflected by the mirror 928, light propagating into right direction of the paper sheet is also provided. The pair of lights forms standing wave within the optical path 920, to form a pattern of optical fields with interchanging significant intensity and substantially zero intensity in the optical field while oscillating at the frequency of the light. The pattern thus created is the optical lattice, which has lattice points where optical fields has maximum amplitude. Namely, the laser source 930 function as a lattice laser source that provides a lattice laser pair. An optical lattice clock based on the concept of magic wavelength is made by setting the wavelength of the lattice laser source to a magic wavelength $\lambda_m$. In contrast, the light provided by the laser source 932 has a function to excite the clock transitions of the cooled atoms 950 while the laser source 932 provides light to the identical light path in a similar manner as the laser source 930. Therefore, the laser source 932 functions as a clock laser. The frequency of the laser source 932 is stabilized by utilizing a reference cavity, and wavelength of the light outputted can be slightly modified by an acousto-optic modulator AOM.

With respect to clock transitions of the cooled atoms 950 in FIG. 1A, a detector 960 detects light absorption or emission due to the clock transitions, and a servo controller 970 feedbacks to the laser source 932. In particular, the clock laser from the laser source 932 is irradiated to the cooled atoms 950, and excitation probability is observed by way of an amount of absorption or emission of light at a frequency range. Then the frequency of clock laser is feedback controlled by the acousto-optic modulator AOM in such a way the excitation probability follows ½.

An enlarged schematic diagram for beam waist 910 is indicated un FIG. 1B, where the beam waist 910 has a strong intensity lattice laser pair from the laser source 930. At the beam waist 910 a standing wave is formed by interference of lattice lasers, one from right and the other from left. Intensity distribution of the optical field forming the standing wave has spatial period of $\lambda_L/2$ where $\lambda_L$ a wavelength of the lattice laser. While the spatial period of $\lambda_L/2$ becomes lattice spacing, the cooled atoms 950 are attracted to antinodes of the oscillating optical field, or the lattice points. In addition, the intensity of the optical field by the lattice laser has a distribution in radius direction according to laser modes. FIG. 1B indicates positional dependence of the optical intensity of fields that form the optical lattice.

Potential acting on the atoms in FIG. 1C has an inverted shape of the intensity distribution of the optical field that forms the standing wave for the optical lattice, and is proportional to negative values of squared intensity of the optical field. That is, the potential has values of squared absolute values of the optical field averaged over a period of time longer than a frequency of the light, multiplied by a negative coefficient of proportion. Deep potential wells are formed where the intensity of the optical field is high, thus resulting potential distribution has repeated spatial undulations according to the intensity of the optical lattice while having a minimum at each lattice point. The actual potential also varies along radius direction of the beam similarly as in FIG. 1B, which is not depicted in FIG. 1C. Therefore, the potential has a downward convex shape with its minimum at the beam center when the intensity of the optical field by the lattice laser increases toward the beam axis. If cooled atoms 950 are trapped in a favorable manner at the lattice points, then a range where the cooled atoms 950 can be found ($\Delta x$) is reduced than the lattice spacing $\lambda_L/2$. In the meantime, the Lamb-Dicke confinement is realized when $k_p \Delta x < 1$ is satisfied in connection with $k_p = 2\pi/\lambda_0$, where $\lambda_0$ denotes a wavelength of the laser source 932, which is a clock laser, or a wavelength of a laser for probing with a similar frequency (not shown), which also is a clock laser. In this regime clock transitions of the cooled atoms 950 will not experience Doppler effect against a wavelength of clock transition light or the clock laser.

When the entire optical lattice is viewed broadly, ranges where the trap actually takes place are limited to around 150 micrometers as in FIG. 1B, which is sufficiently smaller than the Rayleigh length. It is not appropriate to make observation for the optical lattice clock outside of this range, even a lattice laser pair is found there. When the cooled atoms 950 are fermions with their spin polarized as in FIG. 1C, trapping around 10 atoms per one potential well would not cause any interaction in principle among the trapped atoms in each well, which makes it possible to reduce interaction among the cooled atoms 950. However, when the number of trapped atoms per a potential well far exceeds 10, interactions among atoms would create problems. Even the entire part of the optical lattice within a range of around 150 μm mentioned above includes about 4000 lattice points there, which is estimated by 150 μm/($\lambda_L/2$), the limitation mentioned above restricts the total number of atoms engaged in clock transitions to merely ~40000. That is, it is difficult in conventional optical lattice clock 900 to further increase the number of cooled atoms 950 that engage in clock transitions while keeping the accuracy of the clock transitions.

2. Optical Lattice Clock of Present Embodiment

An optical lattice clock of the present embodiment is described. In the optical lattice clock of the present embodiment an optical waveguide having a hollow pathway is adopted. This is devised in anticipation of accuracy improvement by increasing the number of atoms engaged in clock transitions, or Nin Formula (1). That is, for the purpose of increasing the number of atoms mentioned above, increasing an effective volume of a space region in an optical lattice where atoms can be trapped should lead to evenness of the lattice laser light over an extended range, which should result in increase of the number of lattice points.

2-1. Structure

Figure 2:
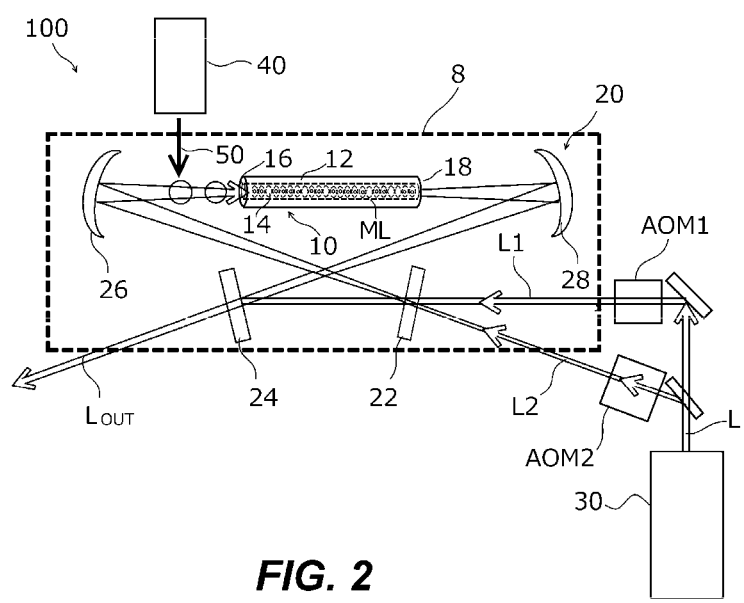
FIG. 2 is a schematic diagram indicating a structure and operation principle of an optical lattice clock in an embodiment of the present disclosure.
Figure 3A:
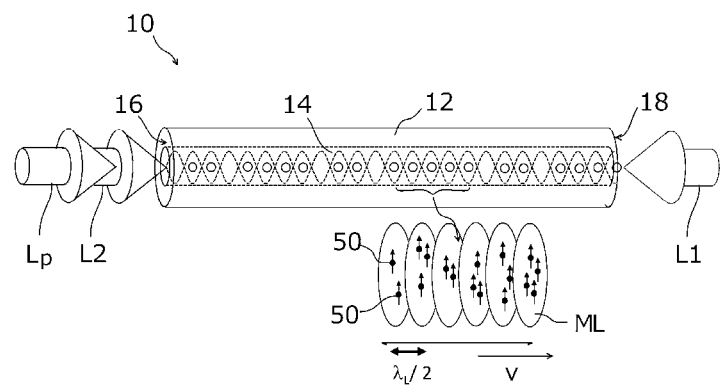
FIGS. 3A-3B is a schematic diagram indicating function in an optical waveguide for an optical lattice clock in an embodiment of the present disclosure.
Figure 3B:
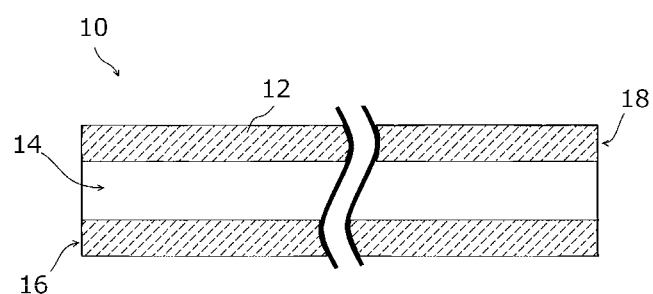

FIG. 2 is a schematic diagram indicating a structure and operation principle of an optical lattice clock in the present embodiment. FIGS. 3A-3B is a schematic diagram indicating function in an optical waveguide for an optical lattice clock in the present embodiment. FIG. 3A is a schematic view depicting overall structure where the optical lattice is formed in the optical waveguide and a manner in which atoms are trapped in the optical lattice, whereas FIG. 3B is a cross sectional view indicating the structure of the optical waveguide.

As shown by the optical arrangement of the optical lattice clock 100 in FIG. 2, the optical lattice clock 100 has an optical waveguide 10, a laser source 30, and a laser cooler 40. The optical waveguide 10 has a hollow pathway 14 extending from a first end 16 to a second end 18 while being surrounded with a tubular wall 12, and uses the hollow pathway 14 for a waveguide path. The pathway 14 becomes a midway part of the mirrors 26 and 28 of the optical path 20. The laser source 30 supplies a lattice laser pair L1 and L2 to the optical path 20, each of which travels in an opposite rotational direction with each other. The laser cooler 40 supplies cooled atoms 50 of atoms having two levels of electronic states associated with clock transitions to the vicinity of the first end 16 of the optical waveguide 10. For evacuating spatial region to a vacuum where the cooled atoms 50 travel and are transported, operational space 8 is kept in a high-vacuum state.

In addition to mirrors 26 and 28, the optical path 20 has the same structure as a bow-tie resonator, for example, with a combination of a semi-transmissive mirror 22 and a dichroic mirror 24. The lattice laser L1 propagates through the semi-transmissive mirror 22, reflected by the dichroic mirror 24, and irradiated by the mirror 28 to the second end 18 side opening of the pathway 14. In contrast, the lattice laser L2 propagates through the semi-transmissive mirror 22, and irradiated by the mirror 26 to the first end 16 side opening of the pathway 14.

The lattice laser pair L1 and L2 is a pair of lasers, each of which has a magic wavelength that brings mutually identical amounts of light-shifts to the two levels. The lattice laser pair L1 and L2 forms a moving lattice ML that moves from the first end 16 to the second end 18 in the pathway 14 of the optical waveguide 10. The cooled atoms 50 make clock transitions while being trapped by the moving lattice ML and transported through the pathway 14 from the first end 16 to the second end 18. It is to be noted that the lattice laser pair L1 and L2 is such that the frequencies of the lattice lasers L1 and L2 ($\omega_1$ and $\omega_2$, respectively) are identical with each other when each of them are viewed on the moving frame of a velocity v, with which the atoms are transported, and are exactly the same frequency as that of light of the magic wavelength. To give such a difference, a laser light L from the laser source 30 is split into the lattice lasers L1 and L2, and then a minute frequency shift is given to a frequency of at least one ray of them due to a Doppler effect by an acousto-optic modulator. Since the frequency difference is 10 kHz-100 kHz, the lattice lasers L1 and L2 are transmitted through acousto-optic modulators AOM1 and AOM2 respectively. The present inventor and others have reported in Non Patent Document 3 that cooled atoms can be transported into space of microscopic dimension by a moving lattice.

As illustrated in the inset of FIG. 3A, the optical lattice due to the moving lattice ML is a stack of antinode planes extending over radius directions of the pathway 14 created by a standing wave of optical field. After being guided into the tubular wall 12 from the first end 16, the cooled atoms 50 pass through the pathway 14 at the velocity v of the moving lattice ML and exit the pathway 14 from second end 18. Thus a number of cooled atoms 50 are simultaneously trapped at around antinode planes between the first end 16 and the second end 18 of the standing wave of the moving lattice ML, where the number of trapped atoms for each plane is determined by a feed rate of the cooled atoms 50. It is possible to ensure higher stability if the total number of the cooled atoms 50 trapped mentioned above is greater than a predetermined value, such as $10^6$. When spin polarized fermions are adopted, collision among the cooled atoms trapped around each equi-phase plane is suppressed due to statistical property of the particles. Each of the cooled atoms 50 makes clock transition during transportation inside the pathway 14 while being trapped by the moving lattice ML. The clock transitions are detected by a clock laser provided externally in one embodiment. In another embodiment, they can be also detected based on, for example, a light output $L_{out}$ of a light caused by the clock transitions if they have been pumped to exited states in advance.

As illustrated in FIG. 3B, the pathway 14 is surrounded with the tubular wall 12 and extends from the first end 16 to the second end 18. The pathway 14 is communicated with external at the first end 16 and the second end 18.

2-2. Optical Waveguide
2-2-1. Optical Waveguide Embodiment

Figure 4A:
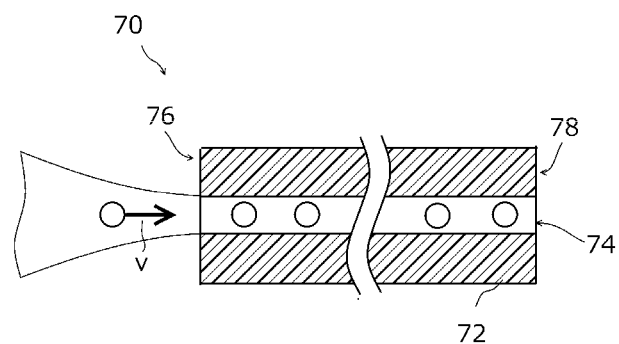
FIGS. 4A-4B is a schematic diagram of a structure of an HC-PCF, which is an example of the optical waveguide in an embodiment of the present disclosure.
Figure 4B:
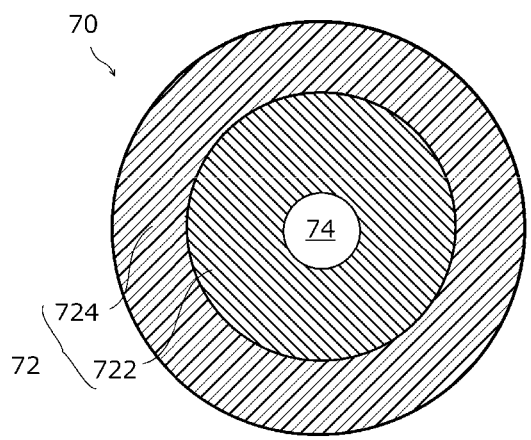

The optical waveguide 10 is described below. The optical waveguide 10 should, first, allow passage of the cooled atoms 50 together with the moving lattice ML through the pathway 14, and second, accommodate the moving lattice by way of the lattice laser pair L1 and L2 with sufficient intensity of the optical field in the pathway 14. Accordingly, the optical waveguide 10 of the present embodiment has the pathway 14 communicated with external at the first end 16 and the second end 18 stated above. Moreover, beam diameters and optical intensities for the lattice lasers that are input from the first end 16 and the second end 18 for the lattice lasers L1 and L2, respectively, into the pathway 14 are maintained by the tubular wall 12. To be more specific, the tubular wall 12 confines the lattice lasers L1 and L2 inside the pathway 14 by reflection. It should be noted that the optical waveguide 10 does not necessarily have a straight shape. Furthermore, mode of propagation for the lattice laser pair L1 and L2 is not necessarily a primary mode. 2-2-2. Example Arrangement of Optical Waveguide FIGS. 4A-4B is a schematic diagram of a structure of an HC-PCF 70, which is an example of the optical waveguide 10. FIG. 4A is a schematic cross sectional view in a plane, on which a pathway 74 in the HC-PCF 70 extends; whereas FIG. 4B is a schematic cross sectional view in a plane that intersects the pathway 74. The HC-PCF 70 is an example of the optical waveguide 10 and has the pathway 74 surrounded with the tubular wall 72 while extending from the first end 76 and the second end 78. The tubular wall 72 in the case of HC-PCF 70 forms photonic crystal fabricated in such a condition that transmission of light of the wavelength identical to the lattice laser pair L1 and L2 guided through the pathway 74 is forbidden. In contrast, the pathway 74 forming a hollow pathway cannot satisfy the condition; therefore, the transmission of light for the lattice laser pair L1 and L2 is allowed therein. As a result, each of the lattice laser pair L1 and L2 propagates from one end to another end only within the pathway 74 in a counter-propagating manner with each other, thereby an optical lattice is created. It should be noted that the tubular wall 72 is made of a PC clad 722 acting as a photonic crystal and a sheath 724 that surrounds it. The PC clad 722 has a structure in which refractive medium parts are arranged with gaps embedded, the gaps are extending along an axis direction of the HC-PCF 70 for allowing evacuation inside themselves when placed in a vacuum. The PC clad 722 forms the photonic crystal forbidding transmission of light of a wavelength identical to the lattice laser pair L1 and L2 due to its arrangement of the refractive medium and the gaps. Total length of the HC-PCF 70, or a length along itself, illustrated in FIG. 4A is 30 mm or longer. The inner diameter of the pathway 74 is 10-100 μm or so.

It should be noted that expanding the spatial region mentioned above should not be an obstacle for the purpose of miniaturizing the optical lattice clocks. Although the Rayleigh length is around 150 μm for example, it is possible to further improve stabilization of optical lattice clocks when an optical waveguide 10, or an HC-PCF 70 having a total length (distance along the optical lattice or the length of the optical lattice) of around 30 mm is adopted. Moreover, in consideration of dimensions of conventional optical atomic clocks, it can be said that the sufficient miniaturization of optical lattice clocks with high precision was achieved when an optical waveguide of 30 mm-class dimension were adopted for optical lattice clocks. In addition to that, there is a trade-off in principle between such miniaturization and clock performance. For example, assume N-time atoms are trapped (N>2) per one antinode of the standing wave, or a lattice point, than before. It may seem to be possible to reduce the length of the optical lattice length into 1/N while unchanging the total number of atoms. However, in reality corresponding N-time increase of atom density in each lattice point leads to N-time increase of collision shifts. This results in deterioration of clock accuracy with N-time uncertainty. This is because there remains residual collision shifts to some extent even for suppressing collisions by adopting the polarized fermions. Therefore, it is preferable to have the optical lattice of a length around 30 mm thereby increasing the number of atoms through expansion of the spatial region as stated above even when miniaturization is targeted, in order to improve stability when determining transition frequency to order of less than 18 digits according to Formula (1) for a relatively short period of time, such as within several second or several tens of seconds.

2-2-3. Optical Lattice in Optical Waveguide

Figure 5:
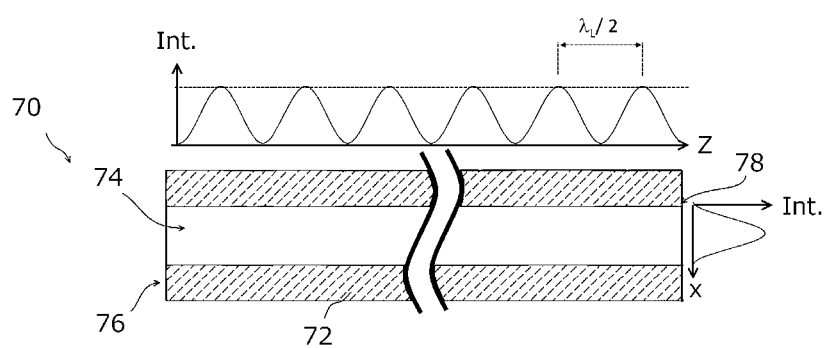
FIG. 5 is a diagram for illustrating an optical lattice inside an HC-PCF in an embodiment of the preset disclosure, which indicates a time averaged intensity over a duration of a squared optical field for an optical lattice that is formed by a fundamental mode laser.

FIG. 5 is a diagram for illustrating an optical lattice in the HC-PCF 70, indicating a time averaged intensity Int of a squared optical field over a duration of an optical lattice that is formed by a fundamental mode laser, for position z along extending direction and position x along radius direction of the pathway 74. The time average in this regard is one over a longer duration than oscillation period of optical field, but not longer than a duration over which translational motion of the moving lattice ML may be observed. The pathway 74 is a space region of a pillar shape extending in one direction. When allowing transmission of the lattice laser pair L1 and L2 in a primary mode for the moving lattice ML through this space region, the moving lattice ML generates lattice points for positions z, and for positions x in each lattice point, where the nearer toward the inner surface of the tubular wall 72, the weaker the optical field of antinodes of the oscillation for the optical lattice becomes. Moreover, the length of the pathway corresponds to the total length of the optical lattice, and the optical field shows highs and lows with a perior of $\lambda_L/2$, which is a half of the wavelength $\lambda_L$, of the lattice lasers for positions along the pathway. For example, the optical field has a maximum at the center part of the pathway 74, and decreases toward the inner surface of the tubular wall 72 with a radius direction distribution like that of a Gaussian. Hence, the cooled atoms 50 that tend to be trapped at positions with stronger optical field do not go closer to the inner surface of the tubular wall 72. As a result, long range interactions such as van der Waals force, Casimir-Polder force, and Lifshits force between the cooled atoms 50 and the inner surface of the tubular wall 72 are suppressed. This is a mechanism that the optical lattice clocks having the optical waveguide 10 as exemplified by the HC-PCF 70 can avoid interactions as atoms and the inner wall of the container of such types when atomic clocks are miniaturized. It is to be noted that such a nature can be obtained not only when the moving lattice ML is a primary mode. This is because the optical field of the optical lattice is reduced in the vicinity of the inner surface of the tubular wall 72 for the optical lattice by the lattice laser pair L1 and L2, even when the moving lattice ML has a higher order spatial mode.

2-3. Estimation of Accuracy 2-3-1. Stability in Determining Frequency

Now we describe rough estimate results concerning accuracy expected for the optical lattice clock of the present embodiment, in consideration of the dimensions mentioned with reference to FIGS. 4A-4B. In the first place, the number of atoms N engaged in observation in Formula (1) for a unit time, such as 1 second, can be easily increased by adopting an optical waveguide 10 or an HC-PCF 70. This is because effective volume of trap region for atoms, which has been limited to a Rayleigh length in the case of conventional optical lattice clocks as in FIG. 1B, can be increased by extending the length of the HC-PCF 70 to 30 mm or longer, as many as 200 times for example (for 30 mm length HC-PCF 70). The optical waveguide 10 or the HC-PCF 70 may cause the optical fields to have such a sufficient intensity that the trap of the cooled atoms 50 is maintained over the entire length of the pathway 14 or pathway 74; this property is unchanged for the optical waveguide 10 or the HC-PCF 70 having further extended length. Therefore, it is possible to increase the number of atoms engaged in the observation to a sufficient level according to the 30 mm length example.

To be more specific, a wavelength $\lambda_m$ is given by $\lambda_m = c/\omega_m$, where c denotes velocity of light and $\omega_m$ the frequency of the optical lattice. It should be noted that the frequency of optical lattice $\omega_m$ is an arithmetic average of frequencies ($\omega_1$, and $\omega_2$) for the lattice lasers L1 and L2 respectively, and also a frequency seen by the cooled atoms 50 on the moving frame that moves at a velocity v. The velocity v at which the moving lattice ML moves is expressed as follows:

$$v = \lambda_m(\omega_1 - \omega_2)/2 = \lambda_m \delta\omega/2 \quad (3)$$

where $\delta\omega$ a difference frequency, $\omega_1 - \omega_2$. Then, lifetime of the atoms, or interaction duration T during which the atoms interact with the optical lattice in the pathway 14 is given by $$\tau = L/v \quad (4)$$

where L is the total length of the pathway 14. A value of $\tau$ can be 1 second, for example.

Estimate result on the number of atoms is described further in detail with an example case where the atom species are ones that can be spin polarized, very low temperature fermions atoms. For the atoms with such property, inter-atom interaction will not exist in principle between the polarized atoms, due to Pauli's exclusion principle. Thus, if polarized atoms are prepared with 100% fraction, then the trap of atoms will not be disturbed. In reality though, it is not possible to prepare the polarized atom with 100% fraction, and resulting collision shifts may raise a problem, as stated above. For this reason, effective volume of the spatial region for trapping atoms is expanded in order to increase the number of atoms without increasing the collision shift.

For initial estimation, let us assume that n atoms are placed per a lattice point with a period $\lambda_L/2$ in the optical lattice in a direction along a length l in the pathway 74. Then the number N of trapped atoms found in the fiber is expressed as $$N = n \, l/(\lambda_L/2). \quad (5)$$

For further realistic estimation, it is necessary to consider another effect. That is, it is necessary to consider the fact that the dimension of each lattice point is restricted to the central part where the optical field is significant, when trap in the pathway 74 is carried out for the dimension as explained in FIGS. 4A-4B; therefore, the atoms do not evenly distribute over the entire spatial region in the pathway 74. In reality, it is closer to the actual situation if we imagine a spheroid with squeezed thickness of 30 nm and 5 μm diameter for each lattice point even assuming $\lambda_L = 800$ nm (approximate value in the case of Sr) further to the dimensions of FIGS. 4A-4B. In such a case, the maximum number of atoms n that can be trapped for each spheroid, while the accuracy is not affected, is around 10. That is, since the atoms density amounts to $1 \times 10^{13}$ cm$^{-3}$ for such a case, it is probable that atom-atom interaction might occur due to collision under very low temperature, or p-wave collision. Fortunately, it is possible in the present embodiment to increase the number of atoms engaged in clock transitions without increasing the atoms density by extending the total length of the optical waveguide 10 or the HC-PCF 70. A simple calculation based on the total length of 40 mm for the HC-PCF 70 in the FIG. 4A would suggest that total number of atoms engaged in clock transitions is ~$10^6$ if 10 atoms are trapped in each spheroid for the series of spheroids mentioned above. It is evident that the total number N of atoms can be increased easily by extending the total length of the HC-PCF 70. Moreover, there is no attenuation of light in principle when the HC-PCF 70, or the optical waveguide 10 in general, is adopted. Actually, the attenuation of light is negligible for the total length of 40 mm, as in the above, or ~100 mm for example.

It is to be noted that atoms that may become very low temperature fermions with spin polarization are neutral atoms having electronic state of total angular momentum J=0, such as Sr atoms and Yb atoms, and more generally, atoms in Group II, Group IV, and Group IIB.

Furthermore, according to the inventor's estimation for reducing the interaction of the cooled atoms 50 with the tubular wall 12 surrounding the pathway 14, it is preferable to make the inner diameter of the pathway 14 to be a certain standard value or more. In particular, the long range interaction stated above may be considered for discussing the effect of the inner surface of the container onto the atoms. Such interactions lead to shift in the clock transition frequency and degrade accuracy of the clock. Therefore, the effect due to the long range interaction on the frequency shift $\Delta f/f$ has been estimated. As a result, we have obtained an estimate result that $\Delta f/f$ is suppressed to be $10^{-17}$ or less at the maximum, when the temperature of the wall of the fiber is kept ~70K or below, assuming that the inner diameter of the tubular wall 72 is around 10-100 μm or so.

These estimate results suggest that it is possible to improve the stability estimated by Formula (1) in the optical lattice clocks to a sufficient level, that is, the value for the Formula (1) can be reduced, and therefore it is possible to suppress the long range interactions between the atoms and the inner wall of the container in a sufficient manner. In other words, it is possible to improve the accuracy of the optical lattice clocks by adopting the optical waveguide 10 or the HC-PCF 70, and even miniaturized optical lattice clocks can be realistic.

2-3-2. Compensation of Doppler Effect

Among shifts found in transition frequency of the clock transitions, or clock frequency, frequency shifts due to Doppler effect can be precisely compensated. In particular, the clock frequency $f_C$ affected by the Doppler shift is expressed as $$f_C = f_{C0}(1+v/c) \quad (6)$$

where c is the velocity of light, and $f_{C0}$ a value unaffected by the Doppler shift. Applying Formula (3) to this expression yields $$f_C = f_{C0}(1+\delta\omega/2\omega_m). \quad (7)$$

The shift amount $\delta\omega/2\omega_m$ can be precisely compensated.

2-4. Cooled Atoms

In a typical mode of operation, the cooled atoms 50 are excited immediately before entering the pathway 14 or pathway 74, by polarization or spin polarization. The polarization or excitation is carried out by irradiating a circular polarized light of the laser with one handedness, for example, to the moving lattice ML carrying the cooled atoms at the immediate upstream of the first end 16.

2-4. Detection of Clock Transitions

The clock frequency $f_C$ of the clock transitions in the optical lattice clock 100 is, generally speaking, a different frequency from one for the optical lattice of the magic wavelength. It is possible to determine clock frequency $f_C$ obtained from ongoing clock transitions, through observation of excitation probability of the cooled atoms 50 behind the dichroic mirror 24 if it can pass the light of the clock frequency $f_C$ while reflecting light of the magic frequency. The obtained clock frequency $f_C$ should be a sufficiently precise one. In particular the spectral width can be determined as a reciprocal value of duration of time for which the pathway 14 or pathway 74 is passed through. Moreover, all atoms through the pathway 14 are observed, thus the stability is improved due to such a large number of the atoms observed.

In the actual operation of the optical lattice clock 100, the cooled atoms 50 on which the excitation probability is observed act as reference atoms. For example, the cooled atoms 50 are spin polarized in the initial stage. Then Ramsay spectroscopy is carried out while the cooled atoms 50 are transported by the moving lattice ML in the pathway 14 or pathway 74 by irradiating π/2 pulses for the clock transitions at the entrance (the first end 16) and exit (the second end 18) of the pathway 14 or 74. This enables sensitive detection regarding spectral width corresponding to the reciprocal of the duration for pathway of the pathway 14 or pathway 74. In yet another implementation of the observation, frequency of the clock laser light is estimated based on absorption and phase change of the clock laser light. FIGS. 3A-3B indicates a schematic diagram in which a light for probing clock transitions is input into the optical waveguide 10 and the output therefrom is monitored, where the light for probing clock transitions is denoted generally by the clock laser light $L_p$.

In the case when absorption of the clock frequency $f_C$ is detected, resulting absorption distribution over frequencies reflects observed excitation probability of atoms. Thus a feedback operation toward the light source for the clock laser light $L_p$ (clock laser source, not shown) is adopted with a servo system (not shown) utilizing the absorption distribution. This servo system is the same as one described as the detector 960 and the servo controller 970 with reference to FIGS. 1A-1C. Moreover, dividing the frequency of the clock laser source based on optical frequency comb technique produces a corresponding amount of frequency uncertainty in a microwave region, where the uncertainty is handled more easily. Thus, the optical frequency comb technique can be implemented into a clock device 1000. The clock device 1000 thus obtained enables time measurement with accuracy.

3. Example Structure

Further details of the present disclosure will be described based on an example structure. In the following description of the example structure, specific material, amount of usage, ratio of materials, processing detail, processing order, elements, orientation of parts or specific arrangement thereof, can be modified as necessity without changing the concept of the present disclosure. Therefore, the scope of the present disclosure is not limited by the following example. The same reference numerals are indicated for elements already described, and their description may be omitted.

Figure 6A:
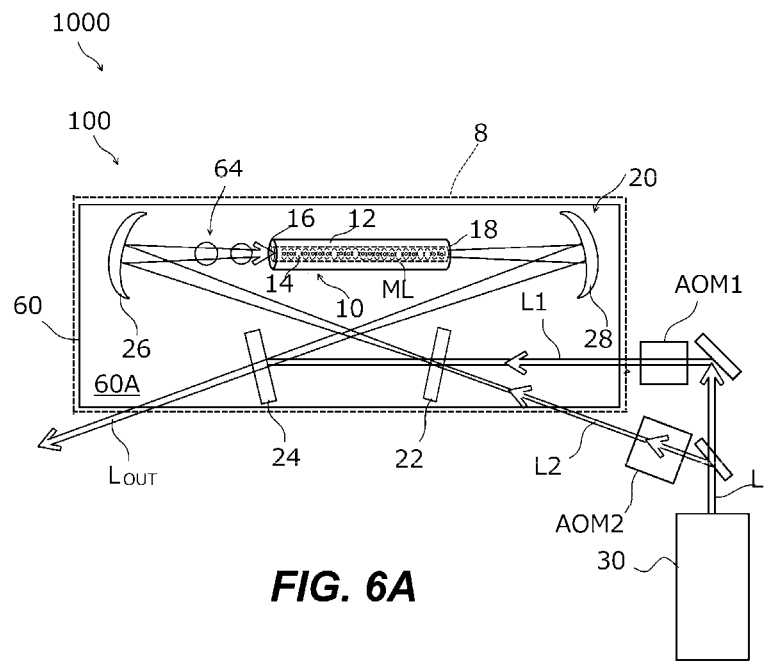
FIGS. 6A-6B is a diagram for an arrangement illustrating an example structure of an optical lattice clock that adopts an HC-PCF for the optical waveguide in an embodiment of the present disclosure.
Figure 6B:
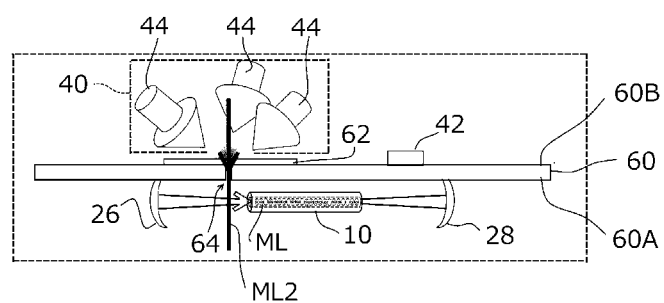

FIGS. 6A-6B is a diagram for an arrangement illustrating an example structure of an optical lattice clock that adopts an HC-PCF for the optical waveguide in the present embodiment. FIG. 6A is a plan view on one side of a substrate 60 defining the optical path 20, and FIG. 6B is a top view seen from the upper direction of paper surface of FIG. 6A. It is to be noted that some elements are abbreviated in FIG. 6B. The clock device 1000 has the optical lattice clock 100 indicated in FIG. 2. The optical waveguide 10, optical path 20, laser cooler 40 are mounted onto the substrate 60 with a small thermal expansion coefficient. For example, the optical waveguide 10, and optical path 20 are mounted on a first surface 60A and the laser cooler 40 are mounted on a second surface 60B of the substrate 60. For supplying the cooled atoms 50 to the first end 16 of the optical waveguide 10 on the first surface 60A, a via hole 64 is formed that connects the first and the second surfaces 60A and 60B. The position of the via hole 64 is determined such that its opening on the surface 60A side is placed in the vicinity of the first end 16 of the optical waveguide 10. In the surrounding area of the opening of the via hole 64 on the second surface 60B provided is a mirror 62. Lasers 44 are incident to the mirror 62 from different directions. The lasers 44 form a cooling photon field near the mirror 62 for cooling atoms with the help of the mirror 62.

Atoms are supplied into a space on the second surface 60B side from an atom feeder 42. The atoms are cooled while interacting with the cooling photon field, and then supplied to the first surface 60A side through the via hole 64. To deliver the cooled atoms 50 toward the moving lattice ML through the via hole 64, an additional moving lattice ML2 is formed in such a manner that it passes through the via hole 64. The cooled atoms 50 delivered to the first surface 60A side then enter into the interior of the pathway 14 from the first end 16 of the optical waveguide 10 and finally exit from the second end 18 in accordance with the moving lattice ML formed by the lattice laser pair L1 and L2 in the spatial region there.

The lattice laser pair L1 and L2 is expanded while they propagates in space outside of the optical waveguide 10. Thus, after departed from optical waveguide 10, intensity of optical field of the moving lattice ML is so weakened that the trap of the cooled atoms 50 cannot be maintained. Consequently, the cooled atoms 50 are no longer trapped by the moving lattice ML of the lattice laser pair L1 and L2 after they departed the second end 18, and will be evacuated by vacuum system (not shown) equipped for keeping a high vacuum. Light due to clock transitions may be output as light $L_{out}$, or the clock transitions may be detected by clock laser light, not shown. The clock device 1000 generates time reference signal based on the highly accurate signal of the clock transitions. Therefore the clock device 1000 can provide highly precise time information. On top of that, the structure can be built in a relatively compact configuration when the substrate 60 is adopted.

Detailed estimation of apparatus dimension of the clock device 1000 is as follows: the substrate 60 maybe a glass sheet with low thermal expansion of a plane shape of ~50 mm×100 mm of ~5 to 10 mm thick. In addition, semiconductor lasers may be adopted for the lasers 44, laser source 30, light source for excitation or polarization (not shown), or light source for the moving lattice ML (not shown). Apparatus dimension of the clock device 1000 that use an external supply of the electric power for operation may be reduced to be accommodated in 19" rack in the end. As stated above, the clock device 1000 can be sufficiently miniaturized while keeping its high accuracy.

4. Variations

Description will be made on an active type oscillator and a laser light source, which are variations of the optical lattice clock 100 of the present embodiment described above. The optical lattice clock 100 in FIG. 2 or 6 can be operated for an active type oscillator and a laser light source. In particular, the optical path 20 such as bow-tie resonator may act as a laser cavity for lasing through super-radiance and stimulated emission, where the cooled atoms 50 in pathway 14 act as emission medium and laser medium, respectively. That is, being prepared in the upper state of the clock levels, the cooled atoms 50 emit light into the bow-tie resonator modes through clock transitions, or invoke lasing if stimulated emissions are excited in a chain reaction manner. Regardless of types of operation, operations that make light emission are one for an active-type oscillator, that is, an oscillator operation that do not use a clock laser for detection purposes and the light obtained is used as an output. It is easy to manufacture a clock apparatus that uses such output of light as frequency reference. Additionally, it is possible to use absorption behavior between the clock levels of the cooled atoms 50 for implementing a frequency reference.

The active-type oscillator mentioned above may be operated under a condition that the lasing operation is caused by continuous stimulated emissions. In such an operation optical pumping into the upper level of the clock transition is carried out. For example, light or electromagnetic wave of the clock frequency $f_C$ output through the dichroic mirror 24 is a coherent laser output. It should be noted in this operation that population inversion for the lasing operation is achieved. This is because the cooled atoms 50 enter into pathway 14 or 74 with excited states, and exit finally with ground states. If the number of the cooled atoms 50 in polarized state or excited state is kept greater than that for the ground state, high density light or the electromagnetic wave for the clock frequency $f_C$ in the confined space inside the pathway 14 causes the stimulated emissions. To enhance laser output it is effective to perform optical pumping of the atoms during transportation to their upper level of the clock transition via an additional level. In such a case the laser behaves like a three-level laser. The optical pumping may be carried out using a coaxial alignment with the optical waveguide, or the pumping may be performed from wall surface of clad of the optical waveguide.

It should be noted that, to achieve lasing operation, collision shifts are suppressed. For n atoms per one lattice point, transportation rate of the cooled atoms into the pathways 14 and 74, or pump rate $\Gamma_p$ is expressed as:

$$\Gamma_p = nv/(\lambda_L/2), \quad (8)$$

where v is translational velocity of the moving lattice ML, $\lambda_L$ a wavelength of the optical lattice. Atoms thus excited add gain for lasing. When v=4 cm/s and n=10 are assumed, $\Gamma_p$ becomes around $10^6$/s.

Furthermore, effect of frequency entrainment due to the resonator may be avoided by satisfying a condition for bad cavity limit in the optical path 20 in FIG. 2 or 6. The restriction on the lasing spectral width would be mitigated accordingly, where the restriction originates from thermal fluctuations in the laser resonator of the optical path 20. Moreover, the atom cloud has a rod-like shape, which is suitable for Dicke's super-radiance in the HC-PCF 70; therefore, the HC-PCF 70 is useful for laser sources that utilize super-radiance mechanism.

The oscillation frequency shifts due to Doppler effect when the lasing is performed. However, amount of such shift can also be precisely compensated. This compensation is also governed by Formulae (6) and (7). That is, the oscillation frequency of the lasing is identical to $f_C$ in Formula (6) or (7), and amount of shifts $\delta\omega/2\omega_m$, in Formula (7) can be compensated with precision. Furthermore, sufficient output power can be expected for this case. The output p estimated using $\Gamma_p$ is approximated as $hf_0\Gamma/2$, (9) where h is a Plank's constant. The approximate value for the output power P is ~0.1 pW by substituting values for Formula (8). Such an amount for the output P is sufficient for implementing PLL (phase lock loop) by use of common lasers with frequency stabilization.

Dicke's super-radiance is affected by geometrical shape of the atom cloud for excited state. When the atom cloud has a rod-like shape by use of the HC-PCF 70, Dicke's super-radiance can be utilized easily. In addition to that, Fesnel number $F=\lambda d^2/(4 \lambda_c l)$ is much smaller than 1, where d is a diameter of the atom cloud in radial direction, and $\lambda_c$ is a wavelength of the laser. As a result, transverse single mode lasing is easily realized.

Based on the foregoing development, laser light sources adopting principle of the optical lattice clock of the present embodiment would be operated to produce laser light of extreme stability with approximate output of 0.1 pW and frequency uncertainty of $10^{-17}$.

In the above description, embodiments of the present disclosure has been described specifically. Any description in this Specification and Example structure is for the purpose of explanation, therefore the scope of the invention should be determined based on recitations of the claims. Furthermore, other variation based on any combination of the embodiments is included in the present invention, which variation should be also within a scope of the present invention.

INDUSTRIAL APPLICABILITY

The optical lattice clock, clock device and laser light source of the present disclosure are applicable to any sort of equipment that uses the elapse of time for operation.

What is claimed is:

1. A system comprising:
    an optical lattice clock including:
        an atom feeder configured to supply atoms having two levels of electronic states for clock transitions;
        a laser light source configured to form a one dimensional optical lattice made of a standing wave having a selected wavelength, the selected wavelength being a wavelength that generates a mutually identical amount of light-shift for each of the two levels, and the optical lattice being a moving lattice of the standing wave; and
        an optical waveguide having a hollow pathway surrounded by a tubular wall, the optical lattice being formed in the hollow pathway, the atoms being trapped by the optical lattice formed in the hollow pathway, wherein the optical waveguide has a first end and a second end, the hollow pathway extends from the first end to the second end, the laser light source forms the optical lattice in the hollow pathway by supplying a first lattice laser propagating in a first direction and a second lattice laser propagating in a second direction that is opposite to the first direction, and the optical lattice is the moving lattice of the standing wave that moves from the first end to the second end while trapping the atoms, the atoms making the clock transitions while being transported by the moving lattice through the hollow pathway; and
    a clock device configured to use light of the selected wavelength for a frequency reference, the light being absorbed or emitted by the clock transitions.

2. The system according to claim 1, wherein the optical lattice clock further includes a laser cooler configured to cool and supply the atoms into a vicinity of the first end of the optical waveguide for introducing the atoms into the hollow pathway at the first end.

3. The system according to claim 1 wherein the selected wavelength is a magic wavelength.

4. An optical lattice clock comprising:
    an atom feeder configured to supply atoms having two levels of electronic states for clock transitions;
    a laser light source configured to form a one dimensional optical lattice of a standing wave having a selected wavelength, the selected wavelength being a wavelength that generates a mutually identical amount of light-shift for each of the two levels; and
    an optical waveguide having a hollow pathway surrounded by a tubular wall, the optical lattice being formed in the hollow pathway, the atoms being trapped by the optical lattice formed in the hollow pathway;
    wherein the optical waveguide has a first end and a second end, the hollow pathway extends from the first end to the second end, the laser light source forms the optical lattice of the standing wave in the hollow pathway by supplying a first lattice laser propagating in a first direction and a second lattice laser propagating in a second direction that is opposite to the first direction, and the optical lattice is a moving lattice of the standing wave that moves from the first end to the second end while trapping the atoms, the atoms making the clock transitions while being transported by the moving lattice through the hollow pathway.

5. The optical lattice clock according to claim 4, wherein the optical lattice clock further includes a laser cooler configured to cool and supply the atoms into a vicinity of the first end of the optical waveguide for introducing the cooled atoms into the hollow pathway at the first end, the cooled atoms to be trapped and transported by the moving lattice through the hollow pathway.

6. The optical lattice clock according to claim 4, wherein the optical waveguide is a hollow core photonic crystal fiber (HC-PCF) having a hollow core, and the hollow pathway of the optical waveguide is a pathway formed by the hollow core of the HC-PCF.

7. The optical lattice clock according to claim 4, wherein the atoms are introduced into the hollow pathway at the first end at a feed rate such that a total number of the atoms between the first end and the second end of the optical waveguide is greater than or equal to a predetermined value.

8. The optical lattice clock according to claim 4, further comprising a ring resonator having an optical path, the ring resonator configured to use the hollow pathway for at least a part of the optical path, wherein the moving lattice is formed with the standing wave obtained by shifting frequencies of the pair of lattice lasers, and openings of the hollow pathway at the first end and the second end are irradiated by the pair of lasers to be supplied for the ring resonator.

9. The optical lattice clock according to claim 4 wherein the selected wavelength is a magic wavelength.

10. An optical lattice clock comprising:
    an optical waveguide having a hollow pathway surrounded with a tubular wall for its waveguide path, the hollow pathway extending from a first end to a second end; and
    a laser light source that forms an optical lattice made of a standing wave by supplying a pair of lattice lasers, each of the lattice lasers propagating in opposite direction with each other in the hollow pathway, the optical lattice being a one dimensional optical lattice of a selected wavelength that generates a mutually identical amount of light-shift for each of two levels of electronic states of atoms, and the optical lattice being a moving lattice of the standing wave moving from the first end to the second end while trapping the atoms, wherein the optical lattice clock uses the two levels of the electronic states of the atoms that are transported by the moving lattice through the hollow pathway for clock transitions.

11. The optical lattice clock according to claim 10 further comprising: a laser cooler configured to cool the atoms for supplying cooled atoms into a vicinity of the first end of the optical waveguide for introducing the cooled atoms into the hollow pathway at the first end.

12. The optical lattice clock according to claim 11, wherein the cooled atoms are polarized or excited before entering into the first end.

13. The optical lattice clock according to claim 10, wherein the optical waveguide is a hollow core photonic crystal fiber (HC-PCF), and wherein the hollow pathway of the optical waveguide is a pathway formed by a hollow core of the HC-PCF.

14. The optical lattice clock according to claim 10, wherein the atoms are to become spin polarized fermions.

15. The optical lattice clock according to claim 10, wherein the optical waveguide is configured in such a manner that inner diameter of the hollow pathway is greater than or equal to a minimum inner diameter, and wherein the minimum inner diameter makes interaction of the atoms with the tubular wall surrounding the hollow pathway weaker than a predetermined value.

16. The optical lattice clock according to claim 10, wherein a feed rate of the atoms is such that a total number of atoms between the first end and the second end formed by the hollow pathway of the optical waveguide is greater than or equal to a predetermined value.

17. The optical lattice clock according to claim 10, wherein the optical lattice clock uses light for a frequency reference, and wherein the light is to be absorbed due to the clock transitions between the two levels of the electronic states of the atoms positioned in the hollow pathway.

18. The optical lattice clock according to claim 10, further comprising:

a ring resonator configured to utilize the hollow pathway for a part of its optical path, wherein the moving lattice is moved by shifting frequencies of the pair of lattice lasers, and openings of the hollow pathway at the first end and the second end are irradiated by the pair of lattice lasers to be supplied for the ring resonator.

19. The optical lattice clock according to claim 18, wherein the ring resonator is configured to be used for a laser resonator, wherein the atoms positioned in the hollow pathway are configured to be used for laser media, and wherein the optical lattice clock outputs light produced by stimulated emissions through the clock transitions of the atoms.

20. The optical lattice clock according to claim 10, wherein the optical lattice clock uses light for a frequency reference, and wherein the light is to be emitted by the clock transitions between the two levels of the electronic states of the atoms positioned in the hollow pathway.

21. The optical lattice clock according to claim 10 wherein the selected wavelength is a magic wavelength.

* * * * *